US011194258B2

(12) United States Patent
Van Der Logt et al.

(10) Patent No.: US 11,194,258 B2
(45) Date of Patent: Dec. 7, 2021

(54) METHOD AND APPARATUS FOR DETERMINING A FINGERPRINT OF A PERFORMANCE PARAMETER

(71) Applicant: ASML NETHERLANDS B. V., Veldhoven (NL)

(72) Inventors: Léon Maria Albertus Van Der Logt, Schijndel (NL); Bart Peter Bert Segers, Tessenderlo (BE); Simon Hendrik Celine Van Gorp, Oud-Turnhout (BE); Carlo Cornelis Maria Luijten, Duizel (NL); Frank Staals, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/838,139

(22) Filed: Apr. 2, 2020

(65) Prior Publication Data

US 2020/0233310 A1 Jul. 23, 2020

Related U.S. Application Data

(63) Continuation of application No. 16/308,835, filed as application No. PCT/EP2017/065346 on Jun. 22, 2017, now Pat. No. 10,649,342.

(30) Foreign Application Priority Data

Jul. 11, 2016 (EP) .................................... 16178809
Oct. 25, 2016 (EP) .................................... 16195549

(51) Int. Cl.
G03F 7/00 (2006.01)
G03F 7/20 (2006.01)
H01L 21/027 (2006.01)

(52) U.S. Cl.
CPC .......... *G03F 7/705* (2013.01); *G03F 7/70258* (2013.01); *G03F 7/70525* (2013.01);
(Continued)

(58) Field of Classification Search
CPC .. G03F 7/705; G03F 7/70258; G03F 7/70525; G03F 7/70641; G03F 7/70783; H01L 21/027
See application file for complete search history.

(56) References Cited

U.S. PATENT DOCUMENTS 6,429,930 B1 * 8/2002 Littau ................. G03F 7/70591
356/124
6,606,151 B2 * 8/2003 Kunkel .............. G01M 11/0242
356/124
(Continued)

FOREIGN PATENT DOCUMENTS

CN 1450412 10/2003
CN 102566315 7/2012
(Continued)

OTHER PUBLICATIONS

International Search Report and Written Opinion issued in corresponding PCT Patent Application No. PCT/EP2017/065346, dated Nov. 20, 2017.
(Continued)

*Primary Examiner* — Naum Levin
(74) *Attorney, Agent, or Firm* — Pillsbury Winthrop Shaw Pittman LLP

(57) ABSTRACT

A lithographic process is one that applies a desired pattern onto a substrate, usually onto a target portion of the substrate. During the lithographic process, the focus needs to be controlled. There is disclosed a method for determining a fingerprint of a performance parameter associated with a substrate, such as a focus value to be used during the
(Continued)

lithographic process. A reference fingerprint of the performance parameter is determined for a reference substrate. A reference substrate parameter of the reference substrate is determined. A substrate parameter for a substrate, such as a substrate with product structures, is determined. Subsequently, the fingerprint of the performance parameter is determined based on the reference fingerprint, reference substrate parameter and the substrate parameter. The fingerprint may then be used to control the lithographic process.

20 Claims, 7 Drawing Sheets

(52) U.S. Cl.
CPC ...... *G03F 7/70641* (2013.01); *G03F 7/70783* (2013.01); *H01L 21/027* (2013.01)

(56) References Cited

U.S. PATENT DOCUMENTS

| | | | | |
|---|---|---|---|---|
| 6,674,511 B2* | 1/2004 | Nomura | G03F 7/706 | 355/52 |
| 7,042,550 B2* | 5/2006 | Lowisch | B82Y 10/00 | 355/53 |
| 7,110,099 B2* | 9/2006 | Littau | G03F 7/70491 | 356/124 |
| 7,127,304 B1* | 10/2006 | Gould | G05B 19/40938 | 700/20 |
| 7,155,689 B2* | 12/2006 | Pierrat | G06F 30/39 | 716/52 |
| 7,352,439 B2* | 4/2008 | Van De Mast | G03F 7/70525 | 355/53 |
| 7,440,105 B2* | 10/2008 | Adel | B82Y 10/00 | 257/797 |
| 7,695,877 B2* | 4/2010 | Leunissen | G03F 7/70641 | 430/30 |
| 7,869,022 B2* | 1/2011 | Van Boxmeer | G02B 7/28 | 356/237.2 |
| 8,149,384 B2* | 4/2012 | Chauhan | G03F 7/70491 | 355/55 |
| 8,343,693 B2 | 1/2013 | Hirukawa et al. | | |
| 8,438,507 B2* | 5/2013 | Renwick | G03F 7/70441 | 716/54 |
| 8,572,518 B2* | 10/2013 | Tyminski | G03F 7/70641 | 716/52 |
| 8,582,082 B2 | 11/2013 | Staals et al. | | |
| 8,891,061 B2* | 11/2014 | Leewis | G03F 7/70625 | 355/55 |
| 8,947,630 B2 | 2/2015 | Padiy et al. | | |
| 9,041,908 B2* | 5/2015 | Ruoff | G03F 7/70283 | 355/52 |
| 9,086,639 B2* | 7/2015 | McIntyre | G03F 7/706 | |
| 9,099,282 B2* | 8/2015 | Rogers | H01J 37/153 | |
| 9,507,907 B2* | 11/2016 | Fouquet | G06F 30/398 | |
| 9,753,377 B2 | 9/2017 | Cekli et al. | | |
| 9,879,988 B2 | 1/2018 | Liu et al. | | |
| 9,977,344 B2* | 5/2018 | Tel | G03F 9/7026 | |
| 10,001,711 B2* | 6/2018 | Van Dommelen | G03F 7/70683 | |
| 10,025,162 B2* | 7/2018 | Watanabe | H04N 5/232122 | |
| 10,054,862 B2* | 8/2018 | Van Oosten | G03F 7/70516 | |
| 10,133,191 B2 | 11/2018 | Tel et al. | | |
| 10,241,418 B2 | 3/2019 | Hauptmann et al. | | |
| 10,527,949 B2 | 1/2020 | Den Boef et al. | | |
| 10,734,190 B2* | 8/2020 | Ando | H01J 37/153 | |
| 2002/0041373 A1 | 4/2002 | Littau et al. | | |
| 2003/0227604 A1 | 12/2003 | Best et al. | | |
| 2006/0192931 A1* | 8/2006 | Roberts | G03F 7/706 | 355/55 |
| 2006/0265098 A1* | 11/2006 | Gould | G05B 19/40938 | 700/121 |
| 2011/0216293 A1 | 9/2011 | Padiy et al. | | |
| 2013/0050668 A1 | 2/2013 | Kisteman et al. | | |
| 2013/0088696 A1 | 4/2013 | Miyazaki et al. | | |
| 2013/0230797 A1 | 9/2013 | Van Der Sanden et al. | | |
| 2014/0224985 A1* | 8/2014 | Rodgers | H01J 37/22 | 250/307 |
| 2015/0070713 A1* | 3/2015 | McIntyre | G03F 7/706 | 356/625 |
| 2015/0079700 A1 | 3/2015 | Ke et al. | | |
| 2015/0205213 A1 | 7/2015 | Cekli et al. | | |
| 2015/0286887 A1* | 10/2015 | Dave | G02B 27/0025 | 382/275 |
| 2016/0313656 A1* | 10/2016 | Van Dommelen | G03F 7/70641 | |
| 2018/0299770 A1* | 10/2018 | Ten Berge | G03F 1/72 | |
| 2020/0310242 A1* | 10/2020 | Van Haren | G03F 1/42 | |

FOREIGN PATENT DOCUMENTS

| | | |
|---|---|---|
| EP | 1950794 | 7/2008 |
| EP | 2503590 | 9/2012 |
| JP | 2010251500 | 11/2010 |
| KR | 20120104636 | 9/2012 |
| KR | 20130034631 | 4/2013 |
| TW | 201617740 | 5/2016 |
| WO | 2011055758 | 5/2011 |
| WO | 2016087069 | 6/2016 |
| WO | 2016198283 | 12/2016 |

OTHER PUBLICATIONS

Taiwanese Office Action issued in corresponding Taiwanese Patent Application No. 106122767, dated Jul. 19, 2018.
Taiwanese Office Action issued in corresponding Taiwanese Patent Application No. 107142584, dated Jan. 13, 2020.
Korean Office Action issued in corresponding Korean Patent Application No. 10-2019-7003783, dated Feb. 5, 2020.
Chinese Office Action issued in corresponding Chinese Patent Application No. 2017800433419, dated Apr. 20, 2020.
Korean Office Action issued in corresponding Korean Patent Application No. 10-2021-7003835, dated Apr. 13, 2021.
Taiwanese Office Action issued in corresponding Taiwanese Patent Application No. 109122634, dated Jul. 6, 2021.

* cited by examiner

METHOD AND APPARATUS FOR DETERMINING A FINGERPRINT OF A PERFORMANCE PARAMETER

This application is a continuation of U.S. patent application Ser. No. 16/308,835, which was filed on Dec. 11, 2018, now U.S. Pat. No. 10,649,342, which is the U.S. national phase application of PCT/EP2017/065346, which was filed on Jun. 22, 2017, which claims the benefit of priority of European patent application no. 16178809.6, which was filed on Jul. 11, 2016, and European patent application no. 16195549.7, which was filed on Oct. 25, 2016, each of which is incorporated herein in its entirety by reference.

FIELD

The present description relates to a method and apparatus for determining a fingerprint of a performance parameter of a lithographic substrate. More particularly, the present description relates to a method and apparatus for determining a fingerprint of a focus parameter.

BACKGROUND

A lithographic process is one that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically done by imaging the patterning device onto a layer of radiation-sensitive material (resist) provided on the substrate by way of an optical system (e.g. a projection lens). Stepping and/or scanning movements can be involved, to repeat the pattern at successive target portions across the substrate. It is also possible to transfer the pattern from the patterning device to the substrate by imprinting the pattern onto the substrate.

An important property of interest is critical dimension (CD). It is important that structures are formed with accurate critical dimension control over the whole substrate (e.g. wafer). A key parameter in order to control the critical dimension during the lithographic process is the position of the substrate relative to the focal plane of the lithographic apparatus (which may also be known as the "focus setting"). In particular, control of the focus setting must be carefully maintained during exposure of the substrate. This may be achieved by controlling the focus characteristics of the projection lens, and or by controlling the position of the substrate such that it is kept close to the focal plane of the projection lens during exposure of the substrate.

SUMMARY

Typically, focus settings are determined by performing measurements on one or more focus targets. The focus targets are positioned on a patterning device (e.g. reticle) and are patterned onto the substrate using a lithographic step. Typically the patterning device also comprises structures associated with the pattern of the product (e.g. an IC), said structures referred to as "product structures". After patterning the product structures and focus targets are present on the substrate. The focus target are measured (for example in a metrology or inspection apparatus) and the focus setting is determined. The determined focus setting is representative for a certain deviation between a reference and an actual focus setting during exposure of the substrate. Knowledge of the focus setting may be used to correct the lithographic apparatus focus in order to enhance performance of the lithographic process. This correction may be achieved by adjusting an optical element within the projection lens of the lithographic apparatus or by adjusting the position and/or orientation of the substrate with respect to the focal plane of the projection lens of the lithographic apparatus.

The determined focus setting is representative for a certain deviation between a desired and an actual focus setting during exposure of the substrate. Knowledge of the focus setting may be used to correct the lithographic apparatus focus in order to enhance performance of the lithographic process. This correction may be achieved by adjusting an optical element within the projection lens of the lithographic apparatus or by adjusting the position and/or orientation of the substrate with respect to the focal plane of the projection lens of the lithographic apparatus.

However, the focus targets take up space on the substrate. This directly reduces the number of product structures that can be placed on a substrate, which is undesirable. Additionally, the positioning and features of the focus targets may cause interference with nearby product structures, thereby potentially degrading the quality of these product structures.

Further, in order to determine the focus setting it is necessary to carry out test and calibration procedures in addition to the measurements themselves. Furthermore, such measurements have to be carried out using a metrology or inspection apparatus. The substrates under measurement are therefore delayed during the measurement process, which proportionally increases production time and thereby throughput of the lithographic apparatus.

The known method measures the total focus setting for a substrate, which includes all focus error sources. Therefore, it may be difficult to identify the root cause of any defects or focus error sources whilst using the above method and apparatus. The known method does not distinguish between different sources of focus errors (e.g. errors caused by the lithographic apparatus or errors caused by the lithographic process). Accordingly, identifying and correcting focus errors and their source may take a significant amount of time.

Typically the used focus targets are placed on a product reticle (a reticle comprising product structures) and comprise diffractive structures having a pitch smaller than the pitch of the product structures. After these focus targets are patterned (exposed in resist), the focus setting can be determined from diffraction based measurements. Basically the focus setting is reconstructed from the observed diffraction pattern. This method of measuring a focus setting is commonly referred to as "diffraction based focus" (DBF) measurement. Its focus targets are referred to as diffraction based focus targets (eg "DBF targets).

The fact that the focus targets and product structures are patterned during the same lithographic process is essential. The focus targets are exposed at exactly the same conditions as the product structures (same dose settings, illumination mode, lens settings, stage characteristics etc.). The measured focus settings are hence representative for focus behavior of the lithographic apparatus during production, e.g. the determined focus setting is relevant for both focus target and product structures.

The described diffraction based method to measure a focus setting was found to be less successful when the thickness of the resist was chosen to be very thin. This is for example the case when adopting an Extreme Ultra-Violet (EUV) lithographic process for which the resist must be very thin to prevent a too strong absorption gradient throughout the resist stack. In case of a thin resist stack, for example thinner than 50-100 nm a diffraction based method will suffer as the radiation used to perform the diffraction based metrology increasingly becomes reflected from structures underlying the resist pattern. In addition the required pitch of the DBF targets scales with the product structure pitch. Sub-resolution pitches for a EUV process, as required for the DBF targets, will become increasingly challenging in view of manufacturability of the DBF targets on the reticle.

An embodiment of the invention proposes a solution to measure a focus setting representative for the lithographic process during production when adopting a thin resist and/or high resolution lithographic process (for example EUV or a low k1-DUV process).

It is proposed to limit performing measurements on focus targets to a reference substrate. In addition to the focus measurement also a measurement associated with a property of the reference substrate is performed, for example a height map of the reference substrate. Using the reference focus measurement and the measured height map allows determination of a focus fingerprint for any product substrate for which a height map has been determined. A direct focus measurement is then no longer needed to determine focus settings associated with product substrates avoiding the use of space consuming focus targets. In addition to a focus setting also other parameters (referred to as performance parameters) associated with the product substrate may be determined in a similar fashion.

In a first aspect, there is provided a method for determining a fingerprint of a performance parameter associated with a substrate, the method comprising: determining a reference fingerprint of the performance parameter associated with a reference substrate; determining at least one reference substrate parameter associated with the reference substrate; determining at least one substrate parameter associated with the substrate; and determining the fingerprint of the performance parameter based on the reference substrate parameter, the substrate parameter and the reference fingerprint.

In a second aspect, there is provided provides a method for manufacturing devices, wherein device features are formed on a series of substrates by a lithographic process, wherein properties of the processed substrates are measured by one or more measuring processes, and wherein the measured properties are used to determine a fingerprint of a performance parameter according to a method as provided above.

There is further provided a lithographic apparatus comprising means for carrying out a method for determining a fingerprint of a performance parameter as provided above.

There is further provided a computer program product containing one or more sequences of machine-readable instructions for implementing a method as provided above.

It is further proposed to precede a volume manufacturing phase of a lithographic process by a focus setting determination phase in which a production reticle, including focus targets is used to pattern one or more substrates. Typically the substrates pertain to one or more send-ahead lots comprising send-ahead substrates. The substrates are exposed at identical conditions (settings lithographic apparatus) as the product substrates (substrates patterned during the volume manufacturing phase). The focus targets are based on features having a sufficiently large pitch to guarantee good manufacturability and accurate readout on metrology tooling. To enhance the response of the focus target to a focus setting an amount of astigmatism is introduced within the projection lens of the lithographic apparatus while patterning the substrates. The patterned substrates are subsequently measured on a metrology tool and the focus setting is determined based on the measurements. The determined focus setting is used to optimize the lithographic apparatus focus setting during the volume manufacturing phase of the lithographic process. In this fashion it will not be necessary to use focus targets which are not compatible with a thin-resist and/or high resolution lithographic process.

In a further aspect, there is provided a method for patterning a plurality of substrates utilizing a lithographic apparatus, the method comprising: determining a focus setting based on a measurement on a structure on a substrate, wherein the substrate has been exposed by the lithographic apparatus at an aberration setting associated with an enhanced sensitivity of the measurement on the structure to variations of the focus setting; and patterning the plurality of substrates utilizing the lithographic apparatus at a corrected focus setting based on the determined focus setting.

There is further provided a lithographic apparatus comprising means for carrying out the method for patterning a plurality of substrates.

There is further provided a computer program product containing one or more sequences of machine-readable instructions for implementing the method for patterning a plurality of substrates.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
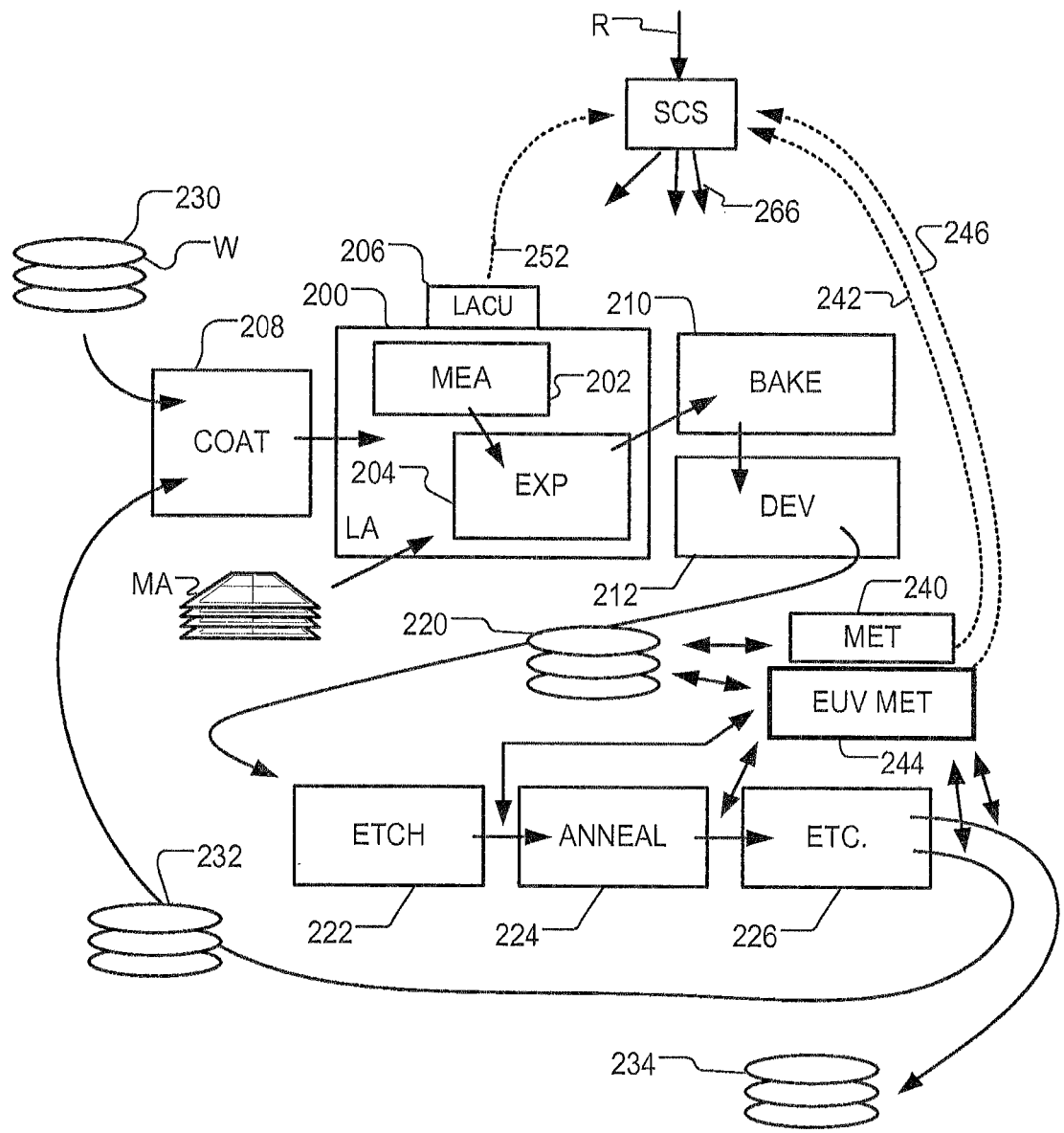
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as focus, overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. The metrology apparatus 240 and/or other metrology apparatuses (not shown) can be applied to measure properties of the processed substrates 232, 234, and incoming substrates 230.

Figure 2:
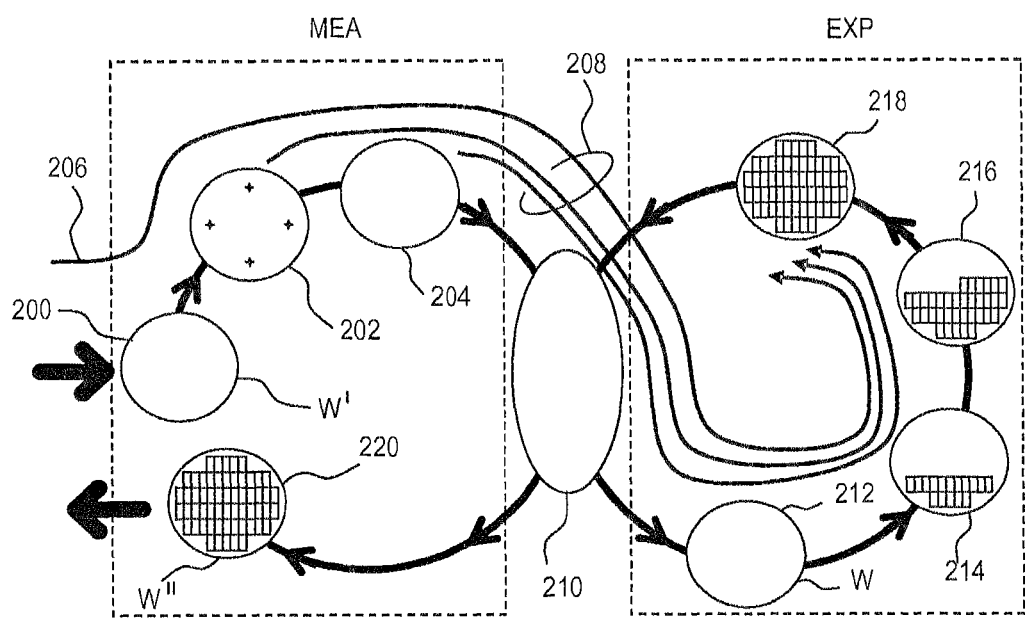
FIG. 2 illustrates the steps to expose a substrate in the dual stage apparatus of FIG. 1.

FIG. 2 illustrates the steps to expose target portions (e.g. dies) on a substrate W in the dual stage apparatus of FIG. 1.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W will be measured using alignment sensor AS. These measurements are used in one embodiment to establish a "wafer grid", which maps very accurately the distribution of marks across the substrate, including any distortion relative to a nominal rectangular grid.

At step 204, a map of substrate height (Z) against X-Y position is measured also using the level sensor LS. Conventionally, the height map is used only to achieve accurate focusing of the exposed pattern. As will be explained further below, the present apparatus uses height map data also to supplement the alignment measurements.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W' is unloaded from the apparatus at step 220, to undergo etching or other processes, in accordance with the exposed pattern.

As described above, performing focus measurements in the known manner requires specific target structures to be provided on the substrate. The presence of such target structures reduces the surface area on the substrate available for product structures. This reduces the number of product structures that may be provided on the substrate, which directly reduces the product yield and increases product costs. Additionally, determining the root cause of focus errors may be difficult since the known method results in a total focus measurement for the substrate. For example, it is non-trivial to determine whether a focus error is due to a process-related effect or whether it is due to a lithographic apparatus-related effect.

Accordingly, it is desirable to omit the use of focus target structures on product substrates. However, this removes the ability to carry out the above-described focus measurements, and in turn prevents the determination of the focus setting to be used by the lithographic apparatus in order to correct for any focus errors in the system. In other terms, removing the focus target structures may significantly reduce the accuracy of the lithographic apparatus.

Further, it is desirable to provide a method of determining a focus setting for a position on a substrate exposed in the lithographic apparatus, wherein it is possible to separate individual sources of focus errors. In other terms, it is desirable to determine the individual factors or properties that may change the required focus setting, thereby potentially causing focus errors, for any given position on the substrate.

It has been realized that it is possible to determine a focus setting for the lithographic apparatus without requiring measurements to be carried out on the above-described focus target structures on product substrates. Instead of using such target structures on the product substrates, which reduces the product yield, the focus setting may be derived from focus measurements performed on one or more reference substrates and one or more sets of focus-related measurement data.

It has been additionally realized that by using a plurality of measurement data, it becomes possible to determine and separate the root causes of focus errors. This, in turn may lead to an improvement in the design processes for subsequent substrates.

Figure 3:
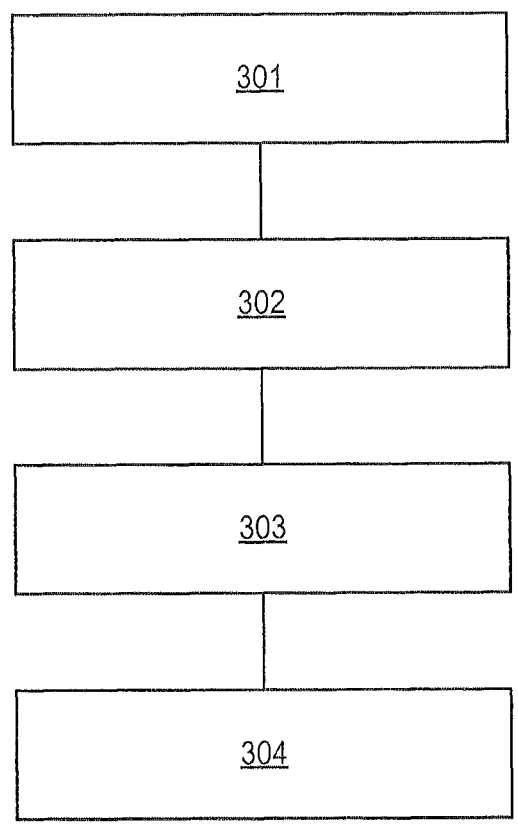
FIG. 3 depicts a method in accordance with a first embodiment of the invention.

An exemplary method for determining a fingerprint of a performance parameter associated with a substrate will now be briefly outlined with reference to FIG. 3. A more detailed discussion will follow below with reference to both FIGS. 3 and 4.

In a first step 301, a reference fingerprint 402 of the performance parameter associated with a reference substrate is determined. The fingerprint of the performance parameter is determined by patterning a number of measurement target structures from a patterning device onto the reference substrate, and subsequently measuring one or more properties of the target structures. In one example, the target structures are designed to allow measurement of a focus setting. The focus setting may be measured in any suitable fashion, e.g. by using the lithographic apparatus or by using a dedicated measurement apparatus. It will be appreciated that, although described in the following with respect to focus setting, other performance parameters may equally well be determined using the exemplary method. The measurement target structures may be designed to allow measurement of performance parameters such as (without limitation): alignment, overlay, dose or critical dimension (CD).

In a second step 302, a reference substrate parameter 404 associated with the reference substrate is determined. When the performance parameter is a focus setting, the reference substrate parameter may, for example, be a height map of the reference substrate (which may for example be measured by a level sensor of the lithographic apparatus). Other reference substrate parameters may be relevant for performance parameters associated with, e.g. overlay or CD performance, including but not limited to: alignment fingerprints (by measurement of alignment mark positions across the reference substrate) or stack characteristics associated with the reference substrate. The stack characteristics may for example be related to resist thickness measurements or reflectivity measurements performed across the reference substrate.

In a third step 303, a substrate parameter 420 associated with the substrate (which is typically provided with one or more product structures) is determined. In an example, the substrate parameter is determined in a substantially identical fashion to the reference substrate parameter, but is determined by measuring a substrate, such as a product substrate containing product features, rather than a reference substrate.

In a fourth step 304, a fingerprint 424 of the performance parameter is determined based on the reference fingerprint 402, the reference substrate parameter 404 and the substrate parameter 420. Knowledge of the fingerprint of the reference performance parameter and the reference substrate parameter, determined for the reference substrate, allows the fingerprint of the performance parameter for the substrate to be determined, as long as the substrate parameter has also been determined. This obviates the need for direct determination of the fingerprint of the performance parameter on the substrate. In the example where the performance parameter is a focus setting, the above-described method enables the focus setting to be determined without requiring focus measurements to be performed directly on the substrate, in turn obviating the need for focus target structures on the surface of the substrate.

It will be appreciated that, while described in respect of focus settings, the above method could, in principle, be used to determine a number of different performance parameters of a substrate. Accordingly, the determination of a focus setting should be seen as exemplary only, and not be interpreted as limiting.

Figure 4:
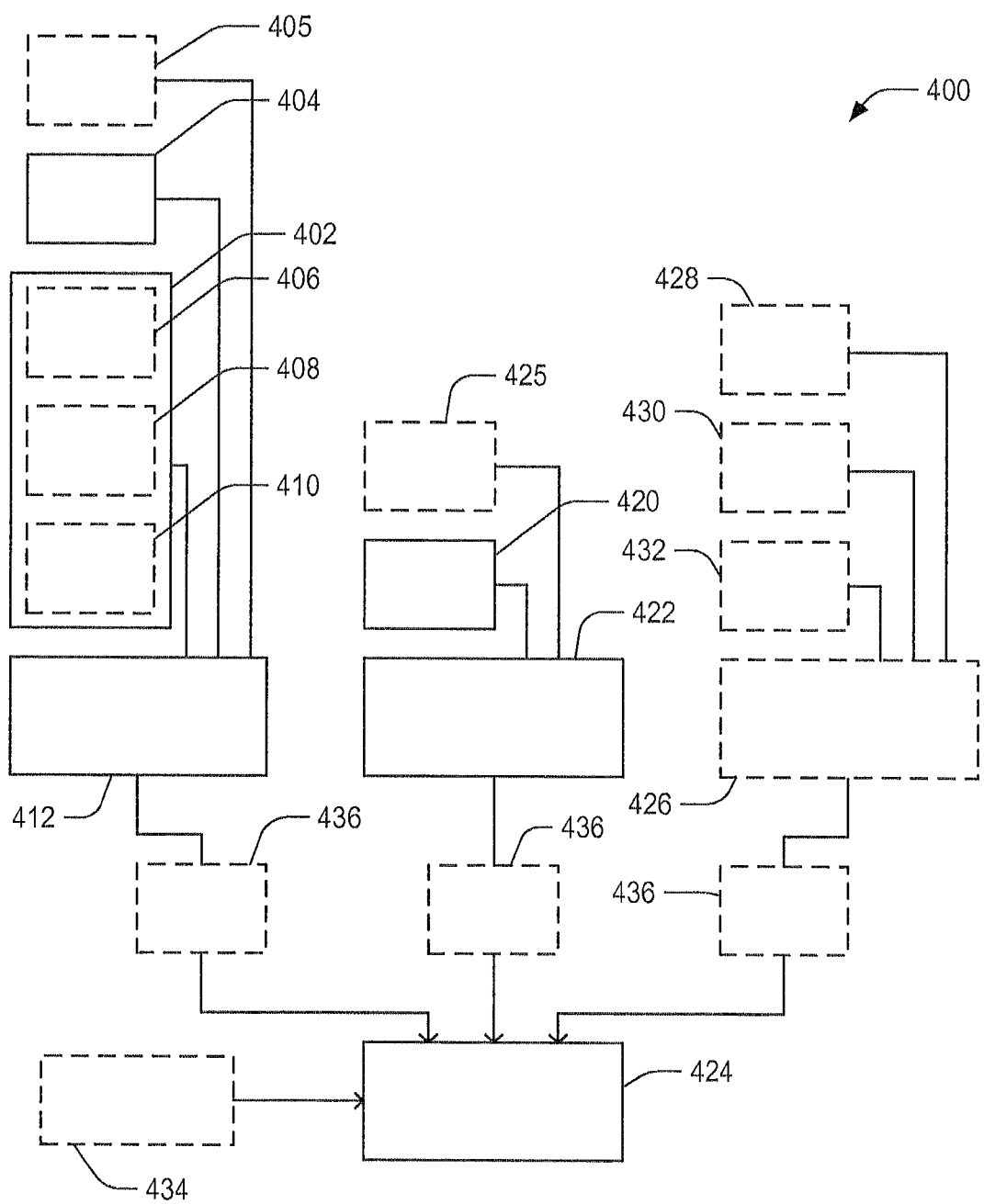
FIG. 4 illustrates a system for carrying out the method of FIG. 3.

The above method will now be discussed in detail with reference to FIGS. 3 and 4. As described, in the first step 301, the reference fingerprint 402 of the performance parameter associated with a reference substrate is determined. In an example, the performance parameter is a focus-related parameter. In a specific example, the reference fingerprint is a focus setting that reflects a relative position of the reference substrate with respect to a focal plane of the lithographic apparatus. As described above, it should be noted that this is for exemplary purposes only. Examples wherein reference fingerprints are determined for other performance parameters (e.g. alignment, critical dimension or overlay error) may be easily envisaged by the skilled person.

In some examples, the reference fingerprint is determined based on one or more specific contributions. Generally, contributions can be divided into two types: intra-field contributions and inter-field contributions. As described above, during exposure, the patterning device is imaged onto the surface of the substrate. Each of the exposed patterns on the substrate surface is referred to as a field. Intra-field contributions refer to contributions that repeat in each field, i.e. contributions that repeat for each individual exposure. Inter-field contributions refer to contributions that are distributed across a part of, or the entirety of, the substrate, i.e. they do not repeat for each field.

In an example, an inter-field contribution 406 to the reference fingerprint is derived based on a first set of reference measurement data. The first set of measurement data may be obtained in any suitable fashion. As described, the inter-field contribution describes substrate-wide contributions to the reference fingerprint. In other terms, the inter-field contribution describes effects or contributions that vary across the entire surface of the substrate, including (but not limited to): deformation of the substrate and/or the substrate stage on which the substrate is placed; or imperfections in the surface of the base substrate. In one example, the first set of measurement data comprises height data describing height variations due to imperfections in the surface of the reference substrate.

Additionally or alternatively, the reference fingerprint may be determined based on other contributions. In one such example, an intra-field contribution 408 to the reference fingerprint is derived based on a second set of reference measurement data. As described, the intra-field contribution describes contributions to the reference fingerprint that are repeated in each field, including (but not limited to): deformation (e.g. bending) of the patterning device (reticle); or deformations in the projection lens.

In some examples, the reference fingerprint may be determined based on a plurality of sets of reference measurement data. In an example, the plurality sets may be obtained by performing measurements on a plurality of reference substrates over a specific period of time. This enables a time-dependent or time-evolving contribution 410 to the reference fingerprint to be derived and taken into account. It will be appreciated that the plurality of sets of reference measurement data may be used to derive one or both of inter-field and intra-field contributions. For example, in one example, the plurality of sets of reference measurement data are used to derive an inter-field contribution. In another example, the plurality of sets of measurement data are used to derive both an inter-field and an intra-field contribution.

By performing reference measurements over a period of time, it additionally becomes possible to determine focus stability for the reference substrates. Such stability information can then be used to emulate and/or predict focus stability for subsequent batches of substrates.

In some examples, the reference measurement data comprises information associated with a characteristic of the lithographic apparatus. As reference substrates typically do not comprise any product structures, the reference measurement data will predominantly reflect the properties of the various components of the lithographic apparatus. In one example, the information is associated with an optical characteristic of an optical system of the lithographic apparatus. In a specific example, the information is representative of aberrations in one or more optical elements (e.g. a lens) of an optical system, such as an exposure system, of the lithographic apparatus. In another example, the information is associated with a characteristic of a positioning system of the lithographic apparatus. In one such example, the information is representative of positioning errors for one or more movable elements or stages (e.g. a substrate stage) of the lithographic apparatus.

It will be appreciated that the reference measurement data may be obtained in any suitable fashion, using any suitable measurement system or methodology. For example, when the information of the reference measurement data is representative of the optical properties of the optical system of the lithographic apparatus, the information may be obtained either by measurement or calculation. In specific examples, the reference substrate has provided on its surface one or more focus targets that are used to perform focus measurements. In other examples, other types of targets or target structures may be used to perform measurements. The measurement results are subsequently used to determine aberration in one or more of the lenses of the optical system of the lithographic apparatus. In other examples, the reference substrate comprises targets or features for position or alignment measurements (e.g. target structures for measuring the alignment of the patterning device), the result of which may in some examples be used to obtain information representative of positional deviations or errors in one or more of the movable elements of the lithographic apparatus.

In the second step 302, the reference substrate parameter 404 associated with the reference substrate is determined. The reference substrate parameter may be determined in any suitable fashion. In some examples, the reference substrate parameter comprises a height map (or other height-related information) for the reference substrate. In a specific example the height map comprises height measurement data obtained by a level sensor. The height measurement data may be obtained at any convenient time. For example, the height measurement data may be obtained prior to the lithographic process, or it may be obtained as part of the lithographic process. Alternatively, the height measurement data may comprise both data obtained prior to the lithographic process and data obtained during the lithographic process.

In general the reference substrate parameter is chosen to be a height map when the performance parameter is (related to) a focus setting. When the performance parameter is (related to) an overlay performance it is more useful to incorporate alignment measurement data associated with the reference substrate (as both overlay and alignment data relate to positions of features defined within the plane of the substrate). It is hence beneficial to use alignment measurement data as a reference substrate parameter. When the performance parameter is a critical dimension one may use stack characteristics data associated with the reference substrate as a reference substrate parameter.

In some examples, the step of determining the reference substrate parameter further comprises obtaining additional reference data 405. The additional reference data may be obtained by performing additional measurements, and may for example be performed in order to increase the accuracy of the height map. For example, the additional reference data may comprise correctional information representative of errors in the height map for the reference substrate, e.g. substrate stage positioning errors. In another example, the additional reference data for the reference substrate parameter comprises correctional data information representative of errors in the height map for the substrate (rather than the reference substrate). Increasing the accuracy of the height map directly improves control of the yield of the lithographic apparatus. For example, increasing the accuracy of the height map allows an improved ability to correct for positional errors (including height errors), which decreases the variance of the height profile of the substrate. If the variance of the height profile is not controlled, the risk is increased that some of the product structures are not exposed correctly and may therefore not be of sufficient quality, which in turn negatively impacts yield and increases the price of each product structure.

The additional reference data may be obtained in any suitable fashion. In some examples, the additional reference data is obtained by an air gauge measurement performed at a suitable time during the lithographic process. Alternatively, in other examples, the additional reference data is obtained by logging positioning errors of one or more movable components of the lithographic apparatus (e.g. substrate or reticle stage positioning errors), the latter being particularly relevant when the reference substrate parameter is related to alignment measurement data.

The first and second steps, in unison, enables an apparatus fingerprint 412 (which may also be referred to as a "scanner fingerprint") that is representative of the properties of the lithographic apparatus to be derived. The apparatus fingerprint may be derived in any suitable fashion. In an example, the apparatus fingerprint is derived by subtracting the reference substrate parameter 404 and the additional reference data 405 from the reference fingerprint 402:

apparatus fingerprint=reference fingerprint−(substrate parameter+additional reference data)

It will be appreciated that the contributors to the apparatus fingerprint described above are exemplary only, and should not be interpreted in any limiting fashion. Other examples, wherein additional or alternative contributors to the apparatus fingerprint are used, would be easily envisaged by the skilled person.

In the third step 303, the substrate parameter 420 associated with the substrate (which is typically provided with one or more product structures) is determined. The substrate parameter is, in some examples, determined in a similar fashion to the reference substrate parameter but for the substrate rather than the reference substrate. Accordingly, it will be appreciated that the various examples and method steps described with reference to the reference substrate parameter may also be applied to the substrate parameter. Typically, the methodology used to obtain the substrate parameter is substantially identical to that used to obtain the reference substrate parameter.

In some examples, the substrate parameter comprises a height map for the substrate. The height map may comprise height data for part of or for the entirety of the surface of the substrate. In an example, the height map comprises height data obtained after at least a first patterning step. In another example, the height map comprises height data obtained after at least a first processing step.

In yet other examples, the height map comprises a plurality of sets of height data, each set having been obtained after one of a plurality of patterning and/or further processing steps. It will be realized that, in principle, any suitable number of sets of height data may be obtained at any suitable time during the lithographic process. Further, it is, in principle, possible to utilize height data from previous substrates or batches of substrates.

In some examples, the step of determining the substrate parameter further comprises obtaining additional substrate data 425, similarly to the reference substrate parameter 404 described above. The substrate parameter and the additional substrate data may collectively be referred to as a processing fingerprint 422. The processing fingerprint may be determined in any suitable fashion. In one example, the processing fingerprint 422 is equal to the sum of the substrate parameter 420 and any additional substrate data 425:

processing fingerprint=substrate parameter+additional substrate data

In some examples, the additional substrate data additionally or alternatively comprises information representative of one or more process-related effects. For example, product structures are becoming increasingly complex with an increasing number of layers and using an increasing number of different materials. Each material may have unique optical properties. Some materials may be opaque at some wavelengths and transparent at others. It is therefore necessary to compensate for any errors in measurements caused by such material-related effects. In some examples, it is assumed that the process-related effects are constant (i.e. that the process dependency is stable over time). In such examples, the contribution relating to the process-related effects is constant. However, in other examples, the process-related effects may be determined to vary over time or in dependence on process parameters.

In the fourth step 304, the fingerprint 424 of the performance parameter is determined based on the reference fingerprint 402, the reference substrate parameter 404 and the substrate parameter 420.

The fingerprint of the performance parameter may be determined in any suitable fashion. In some examples, the fingerprint of the performance parameter is obtained by a simple summation, i.e.:

performance parameter=processing fingerprint+apparatus fingerprint

It will be appreciated that this is merely exemplary and non-limiting. Many specific determination methodologies may be envisaged by the skilled person. For example, the fingerprint of the performance parameter may be obtained by using the above-described summation, to which one or more further parameters are added (e.g. the additional parameter described in the following).

It will be appreciated that the characteristics and parameters used to determine the fingerprint of the performance parameter described in the above are exemplary only. It is, in principle, equally possible to determine the fingerprint of the performance parameter by using alternative or additional parameters and characteristics.

In some examples, in addition to the above-described characteristics and parameters, one or more additional characteristics used to determine the fingerprint of the performance parameter. This may, for example, include characteristics that exhibit temporal variations, or it may include characteristics that are otherwise dependent on a substrate map or individual field maps. The additional characteristics may be used to derive an additional fingerprint 426 for the substrate. The additional fingerprint may also be referred to as a "temporal fingerprint".

In one example, the additional fingerprint 426 comprises movement information 428 of one or more movable components of the lithographic apparatus. For example, the movement information may be associated with movements of a level sensor during a measurement phase. In a specific example, movement information associated with the differences between a movement pattern of the level sensor when performing measurements on a reference substrate and a movement pattern of the level sensor when performing measurements on a product substrate. In another example, the movement information is associated with movement of the patterning device during an exposure step. For example, the movement information may specifically be associated with movement errors during the exposure step, e.g. differences between programmed movements and actual movements.

It will be noted that the above-described movements of the level sensor and/or patterning device are relative to the substrate under measurement. As such, it will be realized that the level sensor or patterning device could equally well be stationary while the substrate is moved. Alternatively, both of the level sensor or patterning device and the substrate may be moved during the measurements.

In other examples, the additional fingerprint comprises one or more temporal characteristics 430 of the optical system of the lithographic apparatus. In one such example, the temporal characteristic is associated with temperature-dependent changes in optical properties of one or more optical components of the optical system of the lithographic apparatus. It is well know that the optical properties of optical components, and in particular optical lenses, may be dependent on the temperature of the component (this effect may sometimes be referred to as "lens heating").

In yet other examples, the additional fingerprint comprises a one or more physical characteristics 432 of a component of the lithographic apparatus. In one such example, the additional fingerprint comprises characteristics of the patterning device, e.g. variations in or deformations of the patterning device. As explained above, the pattern on the patterning device is transferred to the substrate during the lithographic process. Any defects or deformations of the patterning device therefore affect the quality of the pattern transferred to the substrate. For example, deformations of the patterning device will influence the focus setting of the lithographic apparatus. Hence, if such variations can be determined, it becomes possible to modify the focus setting accordingly, thereby increasing the accuracy of the lithographic apparatus.

It will be realized that, in addition to the above-described characteristics and parameters, it is possible to use statistical data and/or data obtained during previous measurements 434. Such data may, for example, have been obtained from previous substrates or batches of substrates. In this manner, it becomes possible to identify, and correct for, variations between batches of substrates.

It will be appreciated that all of the sets of data described above (such as, but not limited to the reference fingerprint, reference substrate parameter, substrate parameter as well as the additional fingerprint) consist of a plurality of discrete data points arranged in a convenient manner. In some examples, data points are arranged in regular grid layouts. In other examples, data points are laid out to cover specific portions of a substrate surface, such as a critical product structure or component.

Figure 5:
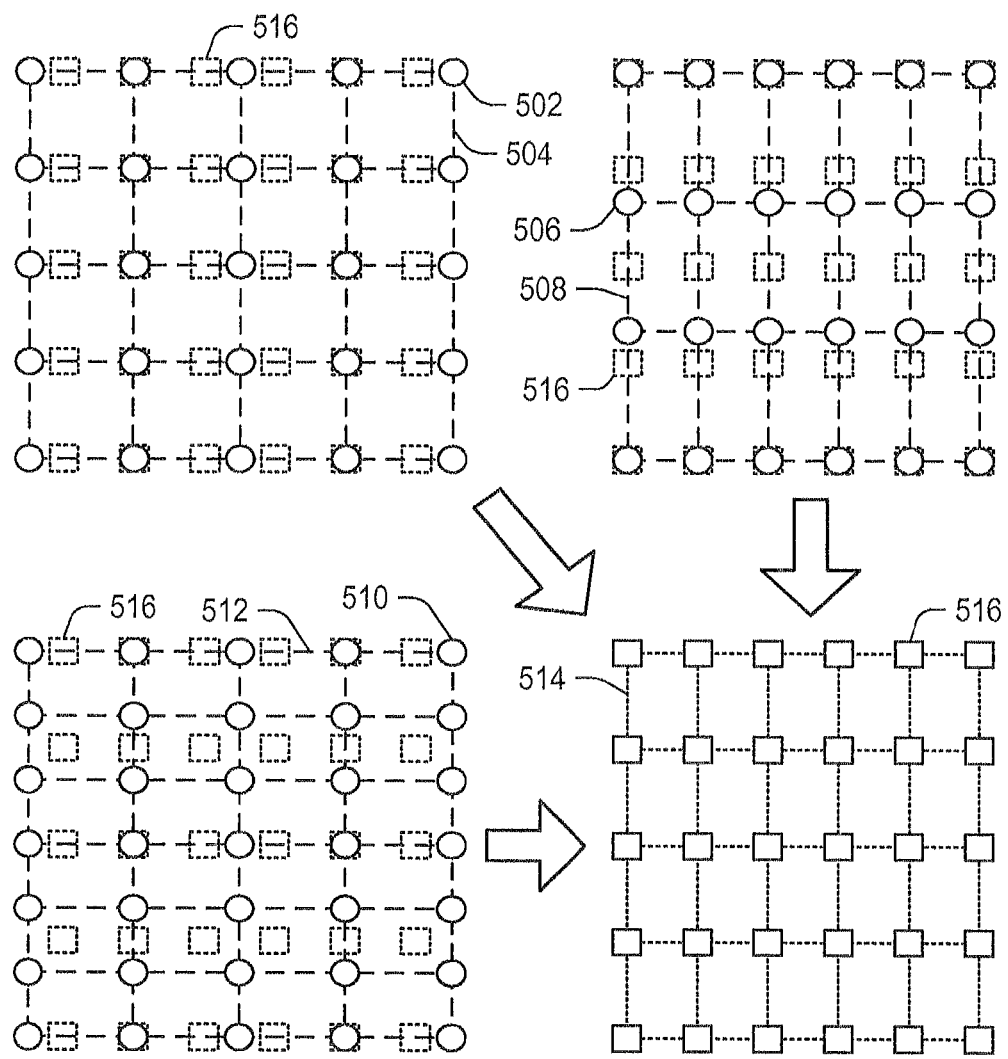
FIG. 5 is a schematic diagram of a method for determining a common grid layout for a plurality of measurement points.

In the above, it has, purely for exemplary purposes, been assumed that the data points of each of the sets of data has been arranged in an identical grid layout. In reality, this may not always be the case, and it will therefore be necessary to modify the sets of data to enable the fingerprint of the performance parameter to be determined. An example of such a process, which will also be referred to as "re-gridding", is illustrated in FIG. 5. It will be appreciated that the grid layouts shown in Figure are purely for exemplary purposes.

FIG. 5 illustrates a situation wherein three sets of data, such as measurement or calculation results, are used. A first set of data 502 is arranged in a first grid layout 504. Similarly, a second set of data 506 is arranged in a second grid layout 508, and a third set of data 510 is arranged in a third grid layout 512. As can be seen, each of the three grid layouts differ from the other two grid layouts.

FIG. 5 further shows a fourth grid layout 514. For comparison with the first, second and third grid layouts, the data points 516 of the fourth grid layout are shown as with dotted lines overlaid on these grid layouts. As can be seen, in order to conform to the fourth grid layout, it is necessary to at least partly derive new data points for each of the first, second and third sets of data. This derivation may be performed in any suitable fashion. In some examples, the derivation may be performed by linear interpolation. It will be realized that, in principle, any suitable interpolation methodology may be utilized.

The properties of the fourth grid layout, e.g. the horizontal and vertical distance between data points on the surface of a substrate, may be determined in a suitable manner. In the example illustrated in FIG. 5, the fourth grid layout has a horizontal spacing that is equivalent to the second grid layout and a vertical spacing that is equivalent to the first grid layout. It will however be appreciated that this is purely for exemplary purpose, and that the skilled person may envisage other grid layouts. In one example, the data points of the first, second and third grid layouts are re-gridded to match the grid layout the lowest density of data points.

Returning to FIG. 4, the re-gridding steps may be carried out at any suitable time during the measurement process illustrated in FIG. 4. However, typically, the re-gridding step 436 is performed immediately prior to the determination of the fingerprint of the performance parameter.

Figure 6:
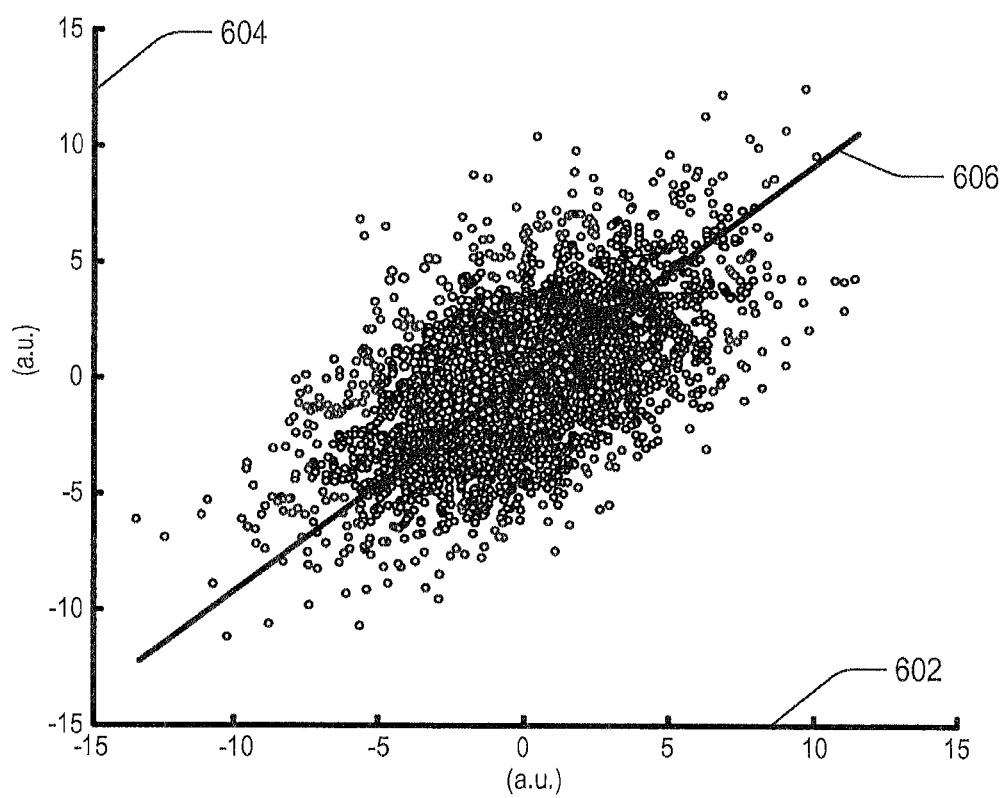
FIG. 6 shows an exemplary comparison between a known method and the method of FIG. 3.

FIG. 6 illustrates the correlation between actual focus setting measurement results, as relating to dedicated focus targets (along the X-axis 602) and calculated focus settings that have been derived using the above-described method (along the Y-axis 604). The line 606 shows a large degree of correlation between measured and calculated results. As can be seen from FIG. 6, the above-described method is useful to determine focus settings across a substrate without performing dedicated measurements on focus target structures.

The described embodiments so far intend to omit the use of focus targets on a product reticle; e.g. the reticle comprising product structures. A reference reticle is used comprising focus targets which, once printed on the reference substrate, are measured using a metrology tool based on analysis of a diffraction pattern generated by interaction of measurement beam and the printed focus target. This is generally considered to be an optimal method to determine a focus setting or focus fingerprint associated with a lithographic apparatus or lithographic process.

As described above, performing focus measurements in the known manner requires focus targets to be compatible with metrology tools based on scatterometry and/or diffraction pattern measurements. For a thin resist and/or high resolution process (EUV based process) the architecture of the diffraction/scatterometer based focus targets becomes impractical. A solution has been proposed in a patent application, application number PCT/EP2016/062259 (not published yet at the moment of writing), wherein a diffraction based focus target is replaced with a focus target consisting of two features, each having a different orientation. An example of such a focus target is a target composed of a horizontally oriented line (or space) and a vertically oriented line (or space), as provided on a reticle comprising product structures. The reticle comprising the focus targets is exposed while introducing an astigmatic aberration CAST' in the projection lens of the lithographic apparatus. The astigmatic aberration causes a different defocussing effect of the horizontal feature with respect to the vertical feature. This is modelled as a shift of a Bossung curve associated with the horizontal feature with respect to a Bossung curve associated with the vertical feature. A Bossung curve expresses the response of a feature parameter (typically a Critical Dimension, often abbreviated to CD) as a function of a magnitude of a deviation of a focus setting 'F' with respect to a reference. In general a Bossung curve can be approximated to a quadratic relation of a parameter (CD) with respect to the focus setting 'F': $CD=a*(F-b)^2+c$. The parameter 'a' is related to the curvature of the Bossung, the parameter cb' is related to a focus shift of a Bossung with respect to a reference focus level and the parameter 'c' is a target CD of the feature. Introduction of an astigmatic aberration will change the position of the focal plane of the projection lens causing a shift of the Bossung; the parameter 'b' will depend on the level of introduced AST. When the astigmatic aberration has axes of symmetry aligned to the orientation of the features (horizontal-vertical) a focus shift 'b' for a horizontal feature H and a focus shift '−b' (opposite sign) for a vertical feature V will be induced. The CD of feature H (CD_H) depends then on F according to: $CD\_H=a*(F-b)^2+c$ and the CD of feature V (CD_V) according to $CD\_V=a*(F+b)^2+c$. When subtracting both CD's the following relation is obtained: $CD\_H-CD\_V=d*F$, the parameter 'd' being a constant. By measuring the difference in CD between the horizontal and the vertical feature it is possible to reconstruct the focus setting 'F' which is often associated with a focus error of the lithographic apparatus. It needs to be mentioned that instead of measuring a CD (using a scanning electron microscope SEM or a scatterometer) also another parameter demonstrating a Bossung curve behaviour through focus may be determined. When using a scatterometer metrology tool this parameter may be associated with an intensity distribution of a zero order light beam after interaction with the focus target. When using a metrology tool based on diffractive measurements a parameter based on a comparison between the energy and/or phase content of the various orders (−1, +1, 0, etc.) may be used.

The focus setting 'F' is defined with respect to a reference focus setting, generally corresponding to the focus setting for which the Bossung curve demonstrates a maximum or minimum value of the CD or other parameter of interest. It is emphasized that the focus setting in this document is always associated with a mode of operation of the lithographic apparatus before introduction of the introduced astigmatism error. The astigmatic aberration does alter a focus setting of a lithographic apparatus, but when referring to the focus setting a focus setting related to effects other than the deliberately introduced astigmatic aberration are meant.

In addition to introduction of an astigmatic aberration also other aberrations may be introduced in case their introduction enhances the focus sensitivity of the structures used for measurement. For example spherical aberrations may be selected in case a focus target is based on a phase shift mask principle. The aberration may be introduced by other methods than manipulation of the projection lens. For example the reticle height (distance between the reticle and the focal plane of the projection lens, as measured along the optical axis of the projection lens) may be adjusted in order to introduce spherical aberrations.

Figure 7:
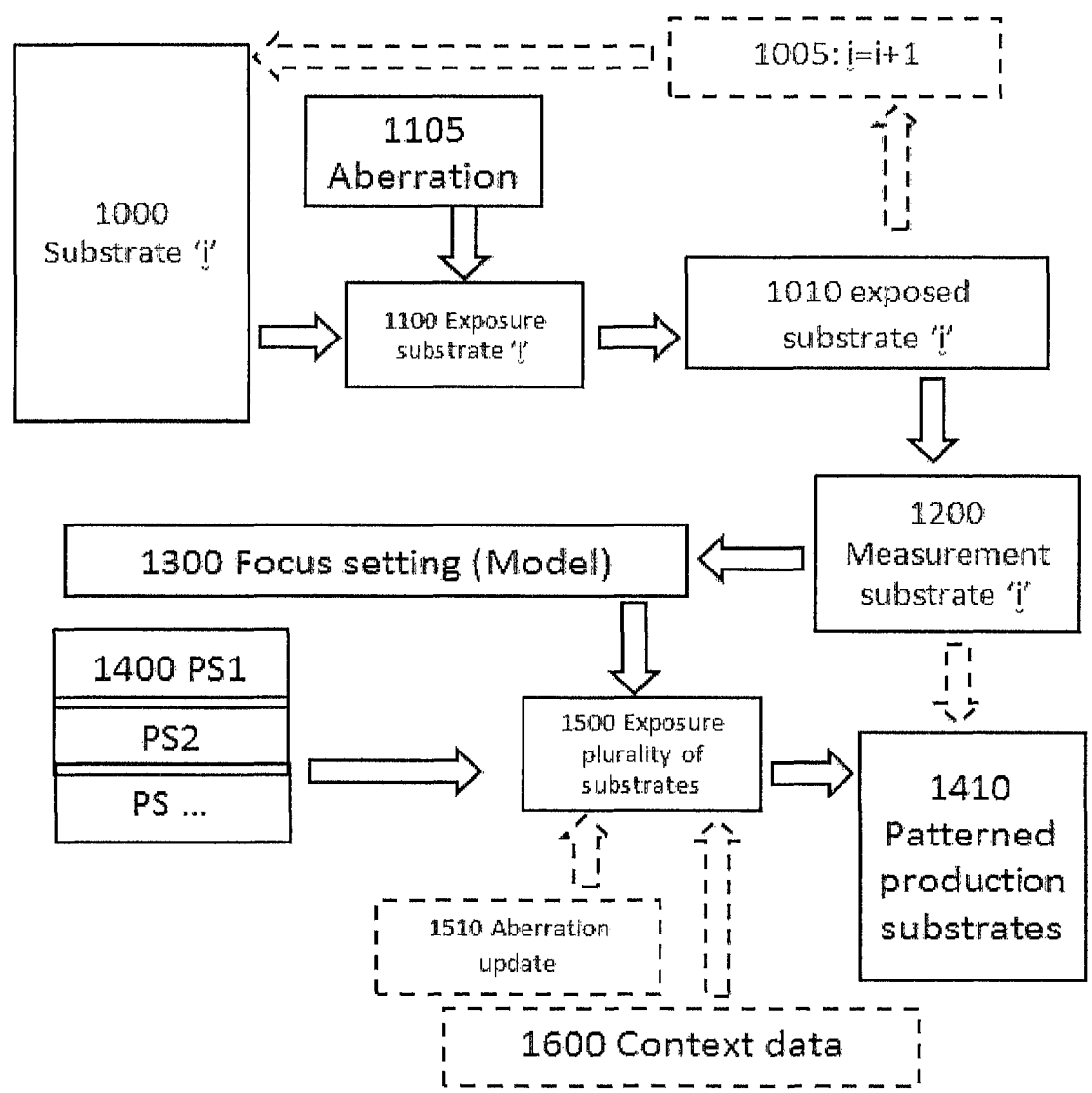
FIG. 7 depicts a functional overview of an embodiment describing a focus setting optimization method.

It has been realized that it is possible to use the above described principle of determining a focus setting of the lithographic apparatus in a volume production environment. The concept is illustrated in FIG. 7. The arrows demonstrate the sequence of steps and products when adopting a method of volume production as proposed by an embodiment. The steps and arrows which are dashed refer to optional steps.

A focus setting 1300 for the lithographic apparatus is determined based on a measurement 1200. The measurement 1200 is performed on a focus target on a substrate 1010 which has been exposed during a step 1100. The exposure 1100 is performed while an aberration 1105 (typically AST) is introduced. The focus target may be chosen from many structures which are sensitive to the focus setting of the lithographic apparatus, in particular when an aberration (astigmatic, spherical aberration) is introduced.

In one embodiment the focus target structures are lines & spaces oriented along two or more directions, for example a pair of lines & spaces. One structure oriented along a horizontal and the other structure along a vertical direction.

In another embodiment the focus target is a single feature for which a first metric associated with a first orientation and a second metric associated with a second orientation are determined. An example of this embodiment is the selection of a contact hole as a single feature for which a horizontal and a vertical dimension are determined. Analog to the previously described case of a target composed out of horizontal and vertical lines a metric based on subtraction of the second parameter from the first parameter may be used to obtain a metric depending linearly on a deviation of the focus setting from the reference focus setting.

In another embodiment instead of dedicated focus target structures, product structures are chosen to determine the focus setting. This is useful if among the product structures features exist which, in combination with the introduced astigmatism, may be used to derive a focus setting of the lithographic apparatus. For example a (CD) measurement on a horizontally oriented and a vertically oriented feature of a product structure may render this a viable solution. The advantage is that in this case no focus targets need to be provided to the reticle, leaving more design freedom and a larger usable area for the product structures.

In another embodiment a time evolving aspect of the focus setting needs to be determined. It is then required to extend the focus setting determination across more than one substrate. After exposure of the substrate a substrate 'i+1' will be selected for an exposure 1100 and measurement 1200 to determine a focus setting 1300 representative for the lithographic apparatus during exposure of the substrate 'i+1'. Exposure of multiple substrates may be useful as during exposure (optical) components of the lithographic apparatus may heat up causing a significantly different focus behavior of the lithographic apparatus. Components like the reticle, projection lens and the substrate itself are prone to heating effects cause by prolonged usage of the lithographic apparatus (exposures). The light used to expose the reticle causes heating of the reticle, projection lens and the substrate. The result is a drift of the focus setting of the lithographic apparatus. By selecting multiple substrates (e.g. repeat step 1005 of selecting substrate 'i+1', wherein refers to the ID of the last exposed substrate) for exposure and subsequent focus setting measurements a typical focus setting evolution during exposure of a (production) lot of substrates may be established.

In another embodiment a model is fitted to the focus setting evolution characteristics. This model may for example be a focus fingerprint (spatial distribution of a focus setting across the substrate) wherein each focus setting value is modelled as a parameterized exponential function in time.

In another embodiment the dose of the radiation used to pattern the substrates 1000 used to determine the focus setting is higher than the dose used during a patterning step of the product substrates 1400. The effect being a stronger heating effect of the components leading to a reduction in substrates 1000 needed to establish a time evolution aspect of the focus setting 1300.

In another embodiment a selection of substrates 1000 out of a lot of substrates is selected for subsequent exposure 1100, measurement 1200 and determination of a focus setting 1300.

In another embodiment one or more substrates out of a plurality of lots of substrates are selected for subsequent exposure 1100, measurement 1200 and determination of a focus setting 1300.

In another embodiment the substrates 1000 used to determine the focus setting 1300 pertain to one or more send-ahead lots comprising send-ahead substrates. As during exposure of the product reticle an astigmatic aberration 1105 was introduced, in many cases the patterned substrates are only useful to determine a focus setting associated with the lithographic apparatus. Focus critical product features are likely to be affected by the deliberately introduced astigmatism and the patterned substrates need to be reworked. This concept is generally associated with the 'send-ahead' principle; send-ahead substrates 1000 from a send-ahead lot are exposed and measured in order to provide improved machine settings for which subsequent (production) substrates 1400 are to be exposed.

In another embodiment the substrates used to determine the focus setting are included within the set of patterned product substrates. When the product structures are not susceptible to astigmatic aberrations (for example when they are unidirectional) the measured substrates may be included within the set of production substrates. This is illustrated in FIG. 7 by the dashed arrow between the measurement step 1200 and the box representing the end product; the patterned production substrates 1410.

After the focus setting 1300 has been determined the lithographic apparatus will be configured to start the patterning step 1500 of product substrates 1400. Typically the product substrates will be exposed at a different aberration setting than during the exposure 1100 of the substrates 1000. The aberration setting of the lithographic apparatus will be updated during a step 1510, although this is not necessary in case of a limited susceptibility of the product structures to astigmatic aberrations.

In another embodiment a correction of the focus setting is applied based on the determined focus setting 1300. This correction may involve adjustment of the projection lens and/or positioning of the substrate 1400 closer to or more parallel to the focal plane of the projection lens. When the focus setting 1300 includes a model describing a temporal evolution characteristic the correction may be dynamical; e.g. the focus setting is adjusted according to an exposure history of the lithographic apparatus.

In another embodiment complimentary focus setting data (other than data 1300) will be used to configure the exposure 1500 of the product substrates 1400. This additional focus setting data is referred to as context data 1600. The context data 1600 may comprise substrate geometry data, levelling data, aberration measurement data, knowledge of topographies of layers on the substrate (based on product structure layouts) or focus setting data associated with substrates measured on other lithographic apparatus.

In another embodiment, apart from the aberration settings 1510, the configuration of the lithographic apparatus is not altered between the exposures 1100 and the exposures 1500. The illumination mode, illumination dose settings, reticle and substrate table parameters are substantially kept identical in order to keep the determined focus setting 1300 as representative as possible for the actual production conditions during the product exposures 1500. Underlying the choice to keep settings equal between exposures 1100 and 1500 is that the heating characteristics of the reticle, projection lens and substrate need to be substantially identical during focus setting determination and volume production conditions.

In another embodiment the exposure 1100 and measurement 1200 of the substrates is done once, or on a very long time interval (weeks, months) as typically the focus setting behavior of the lithographic apparatus during exposure of a lot of substrates will be stable during regular production. This generally applies for both short term evolution characteristics (focus drifts during exposure of one lot) or long term evolution characteristics (focus drifts during exposure of a large number of lots; e.g. during a period longer than one day).

Further embodiments of the invention are listed in the following numbered clauses:

1. A method for determining a fingerprint of a performance parameter associated with a substrate, the method comprising:

determining a reference fingerprint of the performance parameter associated with a reference substrate;

determining at least one reference substrate parameter associated with the reference substrate;

determining at least one substrate parameter associated with the substrate; and determining the fingerprint of the performance parameter based on the first reference substrate parameter, the substrate parameter and the reference fingerprint.

2. A method according to clause 1, the method further comprising a step of adjusting operation of a lithographic apparatus based on the fingerprint of the performance parameter.

3. A method according to clause 1 or 2, wherein the performance parameter is a focus setting reflecting a relative position of the substrate or reference substrate with respect to a focal plane of a lithographic apparatus.

4. A method according to clause 3, wherein the reference fingerprint is determined by measurement of the focus setting across the reference substrate.

5 A method according to any preceding clause, wherein the reference substrate parameter comprises a reference height map for the reference substrate.

6. A method according to clause 5, wherein the reference height map comprises height measurement data obtained by a level sensor.

7. A method according to clause 6, wherein the step of determining the reference substrate parameter further comprises obtaining additional reference data.

8. A method according to clause 7, wherein the additional reference data comprises correctional information representative of errors in the reference height map.

9. A method according to clause 7, wherein the additional reference data comprises correction information representative of errors in a substrate height map.

10 A method according to any preceding clause, wherein the substrate parameter comprises a substrate height map for the substrate.

11. A method according to clause 10, wherein the substrate height map comprises height data for the substrate obtained after at least a first patterning step.

12. A method according to clause 10 or 11, wherein the substrate height map comprises height data for the substrate obtained after at least a first processing step.

13. A method according to any of clauses 10-12, wherein the substrate parameter comprises a plurality of substrate height maps representing a corresponding plurality of patterned layers on the substrate.

14. A method according to any preceding clause, wherein the step of determining the fingerprint of the performance parameter comprises performing a summation of each of the reference fingerprint, reference substrate parameter, and the substrate parameter.

15. A method according to any preceding clause, further comprising a step of adjusting at least one of the reference fingerprint, reference substrate parameter and the substrate parameter so as to cause the data points of each of the reference fingerprint, reference substrate parameter and the substrate parameter to overlap in a reference grid on the surface of the substrate.

16. A method according to any preceding clause, further comprising a step of determining an additional fingerprint of at least one parameter of the substrate or reference substrate.

17. A method according to any preceding clause, wherein the step of determining a reference fingerprint comprises deriving an inter-field contribution to the reference fingerprint based on a first set of reference measurement data.

18. A method according to any preceding clause, wherein the step of determining a reference fingerprint comprises deriving an intra-field contribution to the reference fingerprint based on a second set of reference measurement data.

19. A method according to any preceding clause, wherein the step of determining a reference fingerprint comprises deriving a reference fingerprint based on a plurality of sets of reference measurement data.

20. A method according to any of clauses 17-19, wherein the reference measurement data comprises information associated with a characteristic of the lithographic apparatus.

21. A method according to clause 20, wherein the information is associated with an optical characteristic of an optical system of the lithographic apparatus.

22. A method according to clause 20 or 21, wherein the information is associated with a characteristic of a positioning system of the lithographic apparatus.

23. A method for manufacturing devices, wherein device features are formed on a series of substrates by a lithographic process, wherein properties of the processed substrates are measured by one or more measuring processes, and wherein the measured properties are used to determine a fingerprint of a performance parameter according to the method of any of clauses 1 to 22.

24. A lithographic apparatus comprising means for carrying out the method of any of clauses 1 to 23.

25. A lithographic apparatus according to clause 24, comprising an illumination optical system arranged to illuminate a pattern, and a projection optical system arranged to project an image of the pattern onto a substrate, wherein the lithographic apparatus is arranged to use the determined fingerprint of the performance parameter in applying the pattern to further substrates.

26. A computer program product containing one or more sequences of machine-readable instructions for implementing the method of any of clauses 1 to 23.

27. A method according to clause 1 or 2, wherein the performance parameter is an overlay related parameter.

28. A method according to clause 27, wherein the reference fingerprint is determined by measurement of overlay features across the reference substrate.

29. A method according to clause 27 or 28, wherein the reference substrate parameter comprises an alignment mark position map for the reference substrate.

30. A method according to clause 29, wherein the alignment mark position map comprises alignment measurement data obtained by an alignment sensor.

31. A method according to clause 1 or 2, wherein the performance parameter is a critical dimension related parameter.

32. A method according to clause 31, wherein the reference fingerprint is determined by measurement of critical dimensions across the reference substrate.

33. A method according to clause 31 or 32, wherein the reference substrate parameter comprises a stack property map for the reference substrate.

34. A method according to clause 33, wherein the stack property map comprises resist thickness data.

35. A method according to clause 33 or 34, wherein the stack property map comprises reflectivity data.

36. A method for patterning a plurality of substrates utilizing a lithographic apparatus, the method comprising:

determining a focus setting based on a measurement on a structure on a substrate, wherein the substrate has been exposed by the lithographic apparatus at an aberration setting associated with an enhanced sensitivity of the measurement on the structure to variations of the focus setting; and patterning the plurality of substrates utilizing the lithographic apparatus at a corrected focus setting based on the determined focus setting.

37. A method according to clause 36, wherein the aberration setting is associated with an introduction of astigmatism.

38. A method according to clause 36 or clause 37, wherein a metric is defined being representative for a deviation of the focus setting from a target focus setting.

39. A method according to clause 38, wherein the structure is a focus target.

40. A method according to any of clauses 38 to 39, wherein the structure comprises two features.

41. A method according to clause 40, wherein the metric is based on a first metric associated with a first feature and a second metric associated with a second feature.

42. A method according to any of clauses 36 to 41, wherein the structure is a product structure.

43. A method according to any of clauses 36 to 42, wherein the plurality of substrates is patterned utilizing the lithographic apparatus at a second aberration setting different from the aberration setting associated with an enhanced sensitivity of the measurement to variations of the focus setting.

44. A method according to any of clauses 36 to 43, wherein the measurement is based on analysis of a diffraction pattern of the structure.

45. A method according to any of clauses 36 to 44, wherein the measurement is based on analysis of an image of the structure on the substrate acquired by a metrology tool based on electron beam imaging.

46. A method according to any of clauses 36 to 45, wherein the measurement is based on scatterometry.

47. A method according to any of clauses 36 to 46, wherein the plurality of substrates pertain to one or more lots of substrates.

48. A method according to clause 47, wherein the lots of substrates are associated with a volume manufacturing process.

49. A method according to any of clauses 36 to 48, wherein the measurement is performed on a structure on one or more substrates pertaining to a send-ahead lot.

50. A method according to any of clauses 36 to 49, wherein the measurement is performed on a plurality of focus targets on one or more substrates.

51. A method according to clause 50, wherein the focus setting includes a model establishing a temporal behavior of the focus setting during the step of patterning the plurality of substrates.

52. A method according to clause 51, wherein the corrected focus setting is dynamically adjusted during said patterning of the plurality of substrates.

53. A method according to any of clauses 36 to 52, wherein the corrected focus setting is based on the determined focus setting and additional context data.

54. A method according to clause 53, wherein the context data comprises one or more of: leveling data, substrate geometry data, alignment data, aberration data, reticle data.

55. A method according to clause 54, wherein the measurement is performed on a substrate pertaining to the plurality of substrates.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for configuring a lithographic apparatus, the method comprising:
    determining a focus setting based on a measurement on a structure on a substrate, wherein the substrate has been exposed by the lithographic apparatus at an aberration setting associated with an enhanced sensitivity of the measurement on the structure to variations of the focus setting, the aberration setting introducing a type of optical aberration other than or in addition to focus aberration; and
    configuring the lithographic apparatus for patterning a plurality of substrates based on the determined focus setting.

2. The method according to claim 1, wherein the aberration setting is associated with an introduction of astigmatism.

3. The method according to claim 1, wherein a metric is defined that is representative for a deviation of the determined focus setting from a target focus setting.

4. The method according to claim 3, wherein the structure comprises two features and the metric is based on the first metric being associated with a first feature of the two features comprised within the structure and the second metric being associated with a second feature of the two features comprised within the structure.

5. The method according to claim 1, wherein the structure is a focus target.

6. The method according to claim 1, wherein the structure comprises two features.

7. The method according to claim 1, wherein the structure is a product structure.

8. The method according to claim 1, wherein the configuring the lithographic apparatus further comprises setting a further aberration setting different from the aberration setting associated with the enhanced sensitivity of the measurement to variations of the focus setting.

9. The method according to claim 1, wherein the measurement is based on analysis of a diffraction pattern of the structure.

10. The method according to claim 1, wherein the measurement is based on analysis of an image of the structure on the substrate acquired by a metrology tool based on electron beam imaging.

11. The method according to claim 1, wherein the measurement is based on scatterometry.

12. The method according to claim 1, wherein the plurality of substrates pertain to one or more lots of substrates associated with a volume manufacturing process.

13. The method according to claim 1, wherein the measurement is performed on a structure on one or more substrates pertaining to a send-ahead lot.

14. The method according to claim 1, wherein the measurement is performed on a plurality of focus targets on one or more substrates.

15. The method according to claim 14, wherein the determining of the focus setting further includes establishing a temporal behavior of the focus setting during patterning of the plurality of substrates.

16. The method according to claim 15, further comprising patterning of the plurality of substrates, wherein the focus setting is dynamically adjusted during the patterning of the plurality of substrates.

17. The method according to claim 1, wherein the configuring of the lithographic apparatus is based on the determined focus setting and additional data.

18. The method according to claim 17, wherein the additional data comprises one or more selected from: leveling data, substrate geometry data, alignment data, aberration data, and/or reticle data.

19. A non-transitory computer program product comprising machine-readable instructions, that when executed by a processor system, are configured to cause the processor system to at least:
determine a focus setting based on a measurement on a structure on a substrate, wherein the substrate has been exposed by the lithographic apparatus at an aberration setting associated with an enhanced sensitivity of the measurement on the structure to variations of the focus setting, the aberration setting introducing a type of optical aberration other than or in addition to focus aberration; and
configure a lithographic apparatus for patterning a plurality of substrates based on the determined focus setting.

20. A method for configuring a lithographic apparatus, the method comprising:
determining a focus setting based on a measurement on a structure on a substrate, wherein the substrate has been exposed by the lithographic apparatus at an aberration setting associated with an enhanced sensitivity of the measurement on the structure to variations of the focus setting, the aberration setting introducing a type of optical aberration other than or in addition to focus aberration; and
configuring the lithographic apparatus for patterning a plurality of substrates based on the determined focus setting, wherein the configuring of the lithographic apparatus comprises setting of a further optical aberration setting different from the aberration setting associated with the enhanced sensitivity of the measurement to variations of the focus setting.

* * * * *